(12) United States Patent
Koshiyama et al.

(10) Patent No.: US 7,811,748 B2
(45) Date of Patent: Oct. 12, 2010

(54) RESIST PATTERN FORMING METHOD AND COMPOSITE RINSE AGENT

(75) Inventors: Jun Koshiyama, Kawasaki (JP); Kazumasa Wakiya, Kawasaki (JP); Fumitake Kaneko, Kawasaki (JP); Atsushi Miyamoto, Kawasaki (JP); Hidekazu Tajima, Kawasaki (JP); Yoshihiro Sawada, Kawasaki (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 167 days.

(21) Appl. No.: 11/587,252

(22) PCT Filed: Apr. 20, 2005

(86) PCT No.: PCT/JP2005/007505
§ 371 (c)(1),
(2), (4) Date: Oct. 23, 2006

(87) PCT Pub. No.: WO2005/103832
PCT Pub. Date: Nov. 3, 2005

(65) Prior Publication Data
US 2007/0218399 A1    Sep. 20, 2007

(30) Foreign Application Priority Data
Apr. 23, 2004  (JP) .............................. 2004-129097

(51) Int. Cl.
*G03F 7/40*   (2006.01)
*C11D 7/32*   (2006.01)

(52) U.S. Cl. ....................................... 430/331; 430/311

(58) Field of Classification Search .............. 430/270.1, 430/311, 331, 322, 329; 510/175
See application file for complete search history.

(56) References Cited

U.S. PATENT DOCUMENTS

| | | | |
|---|---|---|---|
| 4,387,222 A * | 6/1983 | Koshar | 544/4 |
| 5,326,672 A | 7/1994 | Tanaka et al. | 430/322 |
| 6,352,818 B1 * | 3/2002 | Hsieh | 430/322 |
| 6,451,510 B1 * | 9/2002 | Messick et al. | 430/311 |
| 2002/0115022 A1 | 8/2002 | Messick et al. | 430/311 |
| 2007/0292808 A1 * | 12/2007 | Koshiyama et al. | 430/324 |

FOREIGN PATENT DOCUMENTS

| | | | |
|---|---|---|---|
| EP | 1 338 923 | * | 8/2003 |
| JP | 57-146766 | | 9/1982 |
| JP | 05-132451 | * | 5/1993 |
| JP | 5-299336 | | 11/1993 |
| JP | 6-163391 | | 6/1994 |
| JP | 7-140674 | | 6/1995 |
| JP | 7-142349 | | 6/1995 |
| JP | 7-226358 | | 8/1995 |
| JP | 7-335519 | | 12/1995 |
| JP | 11-295902 | | 10/1999 |
| JP | 2000-075123 | * | 3/2000 |
| JP | 2002-323773 | | 11/2002 |
| JP | 2003-178943 | | 6/2003 |
| JP | 2003-178944 | | 6/2003 |
| JP | 2003-267900 | | 9/2003 |

OTHER PUBLICATIONS

Toshihiko Tanaka et al., "Mechanism of Resist Pattern Collapse During Development Process", Japan Appl. Phys., vol. 32 (1993), pp. 6059-6064.

* cited by examiner

*Primary Examiner*—Cynthia H Kelly
*Assistant Examiner*—Anca Eoff
(74) *Attorney, Agent, or Firm*—Wenderoth, Lind & Ponack, L.L.P.

(57) ABSTRACT

A method of producing a high-quality product without damaging the physical properties of a pattern to be formed by a rinsing process based on a principle totally different from that for a conventional pattern collapse preventing method. A method for forming a resist pattern by subjecting a photoresist layer provided on a substrate to image-forming exposure and then developing the resultant layer, wherein the resist pattern is formed, after the developing process, by the process of reducing a contact angle with respect to a contact liquid on the surface of the resist pattern to up to 40 degrees, then by the process of increasing it to at least 70 degrees, and further by drying it.

12 Claims, 1 Drawing Sheet

(A)

(B)

(C)

(D)

RESIST PATTERN FORMING METHOD AND COMPOSITE RINSE AGENT

TECHNICAL FIELD

The present invention relates to a method for the formation of a resist pattern without pattern falling during development of a fine pattern having a high aspect ratio as well as a composite rinse solution used therein.

BACKGROUND TECHNOLOGY

Along with the trend in the semiconductor devices, in recent years, toward compact size and high integration, development works were practiced for the use of light sources for fine working including ultraviolet lights such as the g-line and i-line, excimer laser beams such as KrF, ArF and $F_2$, electron beams such as EB and EUV as well as photoresist compositions suitable thereto such as, for example, chemical-amplification photoresist compositions while many of the problems on the lithographic technology in this direction are now on the way of solution.

Meanwhile, one of the problems is pattern falling during formation of a fine resist pattern or, in particular, pattern of a high aspect ratio by the lithographic technology. This pattern falling is a phenomenon encountered in the parallel formation of a large number of patterns on a substrate that adjacent patterns are brought near as if leaning each other eventually leading to breaking or exfoliation of the pattern at the base part. If such pattern falling occurs, desirable products can no longer be obtained resulting in a decrease of the product yield and reliability of the products.

Meanwhile, the reason for this pattern falling has already been elucidated [Japanese Journal of Applied Physics, vol. 32 (1993), p. 6059-6064] and is understood to be caused by the surface tension of the rinse solution acting in the course of drying of the rinse solution during the rinse treatment of the resist pattern after development.

Accordingly, no forces to cause pattern falling are produced when the resist pattern is kept immersed in the rinse solution or, namely, during the rinse treatment after development but, in the course of the drying step to remove the rinse solution, forces due to the surface tension of the rinse solution act between the resist patterns leading to resist falling.

Theoretically, therefore, pattern falling could be prevented by using a rinse solution having a small surface tension or, namely, exhibiting a large contact angle so that it was the attempt heretofore to prevent pattern falling by the admixture of the rinse solution with an additive compound capable of decreasing the surface tension or increasing the contact angle.

For example, proposals were made for a rinse solution with addition of isopropyl alcohol (JP6-163391A), a method in which the contact angle between the resist surface after development and the rinse solution is adjusted to be in the range of 60 to 120° by using a mixture of isopropyl alcohol and water or isopropyl alcohol and a fluorinated ethylene compound as the rinse solution (JP5-2993363A), a method of using a rinse solution having a surface tension adjusted in the range of 30 to 50 dynes/cm by the addition of an alcohol, a ketone or a carboxylic acid for a resist by using a novolac resin or a hydroxypolystyrene resin as the base material of the resist material (JP7-140674A), a method of adding a fluorine-containing surfactant to at least one of the developer solution and the rinse solution (JP7-142349A), a method comprising a step of rinse with water and a step of drying after replacement with a water-immiscible liquid having a small surface tension and having a larger specific gravity than water such as, for example, a perfluoroalkyl polyether while the resist is kept immersed in water (JP7-226358A), a rinse agent composition containing a nitrogen-containing compound having a molecular weight of 45 to 10000 and having a hydrocarbon group with 1 to 20 carbon atoms and an amino group, imino group or an ammonium group in the molecule (JP11-295902A), a method of using a composition containing a fluorinated carboxylic acid, fluorinated sulfonic acid or a salt thereof as the developer solution (JP2002-323773A), a method of treatment of the developed substrate with an organic treatment agent containing a hydrofluoroether after a rinse treatment (JP2003-178943A and JP2003-178944A) and elsewhere.

With each of these rinse solutions or the rinse methods, however, it is not possible to completely prevent pattern falling and, in addition, a risk of decrease is caused in the properties or, in particular, the precision of the pattern formed thereby so that they are not always satisfactory for industrialization.

DISCLOSURE OF THE INVENTION

The present invention has been completed with objects to provide a method for producing high-quality products without damaging the properties of patterns to be formed by a rinse treatment based on a completely different principle from the pattern-falling preventive methods heretofore as well as a novel composite rinse solution which can be used satisfactorily in the above method.

The inventors have continued extensive investigations on a method for preventing pattern falling in the course of development in a method for the formation of a photoresist pattern by the lithographic technology and, as a result, have arrived at a discovery that pattern falling could be prevented without decreasing the inherent properties of the resist per se when the development treatment is followed by a step for decreasing the contact angle on the film surface to 40 degrees or smaller and then by a step for increasing the contact angle on the film surface to at least 70 degrees followed by drying leading to completion of the present invention on the base of this discovery.

Namely, the present invention provides a resist pattern forming method characterized in that, in a method for formation of a resist pattern by subjecting a photoresist layer provided on a substrate to an image-forming light exposure followed by a development treatment, the development treatment is followed by a treatment of decreasing the contact angle on the resist pattern surface against the contacting liquid to 40 degrees or smaller and a treatment for increasing the contact angle to at least 70 degrees followed by drying as well as a composite rinse solution characterized by comprising a combination of a first treatment solution which is a solution of a water-soluble resin having a monomeric unit containing a nitrogen atom and a second treatment solution which is a solution containing a fluorine compound having solubility in water or solubility in an alcoholic solvent.

In the next place, a detailed description is given on the resist pattern forming method according to the present invention.

While the method of the present invention comprises a step of forming a photoresist layer on a substrate, the substrate includes those usually under conventional use as the substrates of semiconductor devices such as, for example, silicon, germanium and alloys thereof.

Formation of a photoresist layer provided on the substrate can be performed by using any one freely selected from among the photoresists under conventional use for the formation of resist patterns including positive-working and negative-working ones without limitations.

The photoresist layer provided on the substrate is subjected to an image-forming light exposure through a photomask pattern by irradiation with ultraviolet lights such as g-line and i-line, laser beams such as KrF, ArF and $F_2$ or electron beams such as EB and EUV followed by a development treatment. The developer solution used here is usually an alkaline aqueous solution such as an aqueous solution of tetramethylammonium hydroxide.

In the method of the present invention, the contact angle of the film surface of the resist pattern developed in this way is, while still wet before drying, first decreased to 40 degrees or smaller or, preferably, to 30 degrees or smaller. The first treatment solution satisfactorily used in this stage is preferably a solution of a water-soluble resin containing nitrogen atoms. This nitrogen atom-containing water-soluble resin can be either one in which the nitrogen atoms are contained in the molecular main chains or can be one containing the nitrogen atoms in the side chains. Water-soluble resins having nitrogen atoms in the molecular main chains are exemplified, for example, by water-soluble resins having amino groups or substituted amino groups of which the resins containing the constituting units of a monomer having a nitrogen-containing heterocyclic group such as pyridine, pyrazine, pyridazine, pyrimidine, triazole, pyrrole, pyrazole, imidazole, thiazole, oxazole, imidazoline, pyrrolidone and the like are particularly preferred. These resins generate positively charged atoms by the localization of electric charges on the ring under the presence of an acid to exhibit a property that a complex is formed between this portion and the acid residue.

The aforementioned water-soluble resin usable here is preferably a water-soluble resin containing a monomeric unit having a nitrogen-containing heterocyclic group represented by the general formula

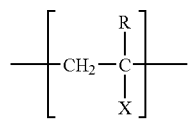

(I)

(in the formula, R is a hydrogen atom or a methyl group and X is a nitrogen-containing heterocyclic group).

Among the monomers represented by this general formula, particularly preferable is at least one kind selected from the monomers having a vinyl imidazole group, vinyl imidazoline group and vinyl pyrrolidone group.

In the method of the present invention, there are used a first treatment solution containing, as the effective ingredient, a water-soluble resin having the monomeric units containing a nitrogen atom and a second treatment solution containing, as the effective ingredient, a fluorine compound soluble in water or soluble in alcoholic solvents represented by the general formula (II). The effective ingredient in the first treatment solution is a copolymer of the monomeric units containing nitrogen atoms and the monomeric units capable of singly forming a water-soluble polymer such as, for example, vinyl alcohol, acrylic acid or methacrylic acid as well as hydroxyalkyl esters thereof and the like as the constituting units. Each of these monomeric units can be contained singly or can be contained as a combination of two kinds or more. These copolymers are marketed from BASF Corp. under the product names of LUVITEC VPI55 K72W and LUVITEC VPI55 K18. Further, polyvinylimidazoline is marketed from TOSOH CORP.

The proportion of the monomeric units containing nitrogen atoms to the monomeric units capable of singly forming a water-soluble polymer in the water-soluble resin used in the inventive method is selected in the range from 10:0 to 1:9 or, preferably, from 9:1 to 2:8 by the mass proportion. When the proportion of the nitrogen atom-containing monomeric units is smaller than that, a decrease is caused in the absorptivity to the resist surface and the complex-forming power with the fluorine compound not to exhibit the desired properties or, namely, the pattern-falling preventing power. The molecular weight of this copolymer is selected in the range of 500 to 500000 or, preferably, 1000 to 200000.

This nitrogen atom-containing water-soluble resin can be prepared by copolymerizing two kinds or more of starting monomers by way of the solution polymerization method, suspension polymerization method and the like according to a conventional method.

While, in the method of the present invention, the resist pattern after the development treatment is brought into contact with the first treatment solution, the concentration of the water-soluble resin in this treatment solution is selected in the range of 0.001 to 10% by mass or, preferably, 0.01 to 3% by mass. The time for treatment with this first treatment solution would be sufficiently long if it be 1 to 30 seconds.

Since the treatment with this first treatment solution decreases the contact angle between the resist surface and an aqueous solution to 40 degrees or smaller or, desirably, to 30 degrees or smaller so as to improve the contacting between the developer solution and the aqueous rinse solution. And, this contact angle can be maintained constant during the rinse treatment with water subsequently undertaken according to need. As an auxiliary effect, an effect of development defects prevention can also be obtained.

It is optional according to desire that the first treatment solution is admixed with an acid to be rendered acidic or admixed with an amine compound or a quaternary ammonium hydroxide to be rendered basic with a pH of 8 or higher. Addition of such compounds has an effect of preventing in-time degradation of the composition.

By decreasing the contact angle on the resist pattern surface after the development in this way, an effect of decreasing the aforementioned defects or, namely, an effect of increasing the efficiency of cleaning can be obtained and, further as a means for decreasing the contact angle thereof, by particularly using the aforementioned water-soluble resin, the re-deposition preventing function giving an effect of further decreasing the defects caused by re-deposition can be improved and, by increasing the adsorption behavior with the fluorine compound used in the second treatment solution, the effect of increasing the contact angle can be further improved.

In the next place, the resist pattern after the treatment with the first treatment solution in this way is subjected, if necessary, to a water-rinse treatment with pure water followed by an increase of the contact angle on the film surface to 70 degrees or larger or, preferably, to 80 degrees or larger. At this stage, contacting is made with the second treatment solution comprising a solution of the water-soluble or alcoholic solvent-soluble fluorine compounds having a functional group capable of forming a complex with the nitrogen atom portion contained in the aforementioned water-soluble resin. The functional group capable of forming a complex with the nitrogen atom portion contained in the water-soluble resin of the first treatment solution includes anionic groups such as, for example, carboxylic acid groups, sulfonic acid groups, phosphoric acid groups and the like although other types of anionic groups may be suitable.

Such a water-soluble or alcoholic solvent-soluble fluorine compound includes preferably the fluorine compounds represented by the general formula

($R_{f1}$ in the formula is a group of a cyclic or linear chain hydrocarbon optionally containing an oxygen atom, nitrogen atom or both, of which all or a part of the hydrogen atoms are substituted by fluorine atoms and Y is a residue of carboxylic acid or a sulfonic acid).

Those preferable as the $R_{f1}$ in this formula include alkyl groups of which a part or all of the hydrogen atoms are substituted by fluorine atoms, cycloalkyl groups of which a part or all thereof are substituted by fluorine atoms or those with at least one carbon atom in these groups substituted by an oxygen atom, nitrogen atom or both.

Those particularly preferable as the fluorine compound represented by this general formula (II) include the fluorine compounds represented by the general formula

or

(m in the formula is an integer of 10 to 15).

Other preferable water-soluble or alcoholic solvent-soluble fluorine compounds include those fluorine compounds represented by the general formulas

(n in the formula is an integer of 1 to 5),

(x in the formula is an integer of 2 or 3)

or

($R_{f2}$ in the formula is an alkyl group of which at least a part of the hydrogen atoms are substituted by fluorine atoms, an alkyl group having a hydroxyl group, alkoxy group, carboxyl group or amino group and y and y' are each an integer of 2 or 3).

Examples of such fluorine compounds include $C_{10}F_{21}COOH$, $C_{11}F_{23}COOH$, $C_{10}F_{21}SO_3H$, $C_{11}F_{23}SO_3H$, $(C_4F_9SO_2)_2NH$, $(C_3F_7SO_2)_2NH$, the compound expressed by the formula

the compound expressed by the formula

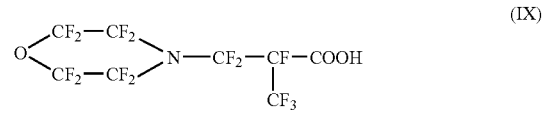

and others.

While the solvent used for dissolving the aforementioned fluorine compounds is water or a mixture of water and an alcoholic solvent, it is particularly advantageous that the solvent used is water so that, among the above-mentioned fluorine compounds, the fluorine compounds readily soluble in water such as, for example, the compounds expressed by the general formulas (VIII) and (IX) are particularly preferred.

The second treatment solution is prepared by dissolving the above-mentioned water-soluble or alcoholic solvent-soluble fluorine compound in water or in a mixture of water and an alcoholic solvent in a concentration of 0.001 to 1.0% by mass or, preferably, 0.01 to 0.5% by mass.

The treatment of the resist pattern with this second treatment solution is undertaken either directly after the treatment with the first treatment solution or after a rinse treatment with pure water by contacting the resist pattern with the second treatment solution for 1 to 30 seconds. By this treatment, the contact angle on the resist pattern surface can be increased to 70 degrees or larger or, desirably, to 80 degrees or larger so that pattern falling can be prevented by spin-drying in this state as such. It is optional to undertake a rinse with pure water after this treatment with the second treatment solution according to need.

In the course of the treatment of the resist pattern with the second treatment solution, it is optional according to desire to increase the temperature of the second treatment solution. Since the surface tension of water, which is 72 dynes/cm at 24° C., can be decreased to 62.6 dynes/cm at 80° C., pattern falling can further be decreased by increasing the temperature.

Though not limitative, the puddle method can usually be applied to contacting of the substrate with the first treatment solution and the second treatment solution.

In the following, the working mechanism of the inventive method is explained by making reference to the accompanying drawing. FIG. 1 is a model illustration showing the behaviors of the molecules of the resin and the fluorine compound in the respective treatment solutions on the resist pattern surface in each of the rinse steps of the inventive method.

Namely, when a resist pattern having a surface contact angle of, for example, 75 degrees after the development treatment is brought into contact with the first treatment solution [FIG. 1(A)], the molecules of the water-soluble resin having nitrogen atoms in the first treatment solution are deposited onto the resist pattern surface with the nitrogen atoms exposed outwardly [FIG. 1(B)] resulting at this stage in a decrease of the surface contact angle down to 30 degrees. Nextly, when a rinse treatment with pure water is undertaken followed by bringing the resist pattern into contact with the second treatment solution [FIG. 1(C)], a complex is formed between the aforementioned nitrogen atoms and the functional groups of the water-soluble or alkali-soluble fluorine compound in the second treatment solution [FIG. 1(D)] so that the resist surface is imparted with strong water-repellency resulting in a drastic increase of the contact angle up to 105 degrees.

When spin drying is undertaken at this stage, accordingly, water can be removed as being free from pattern falling.

BEST MODE FOR CARRYING OUT THE INVENTION

Figure 1:
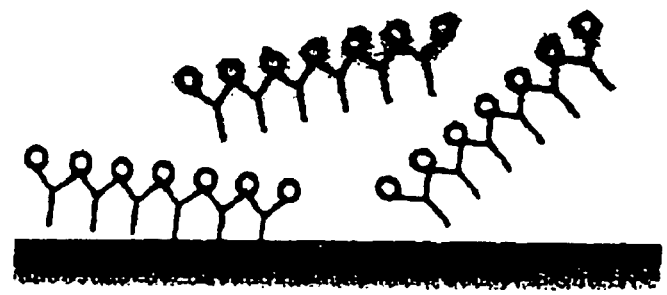
FIG. 1 is a model illustration showing the behaviors of the molecules of the resin and the fluorine compound in the respective treatment solutions on the resist pattern surface in each of the rinse steps according to the inventive method.
Figure 1:
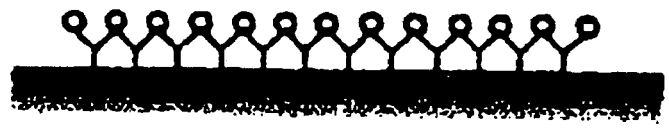
Figure 1:
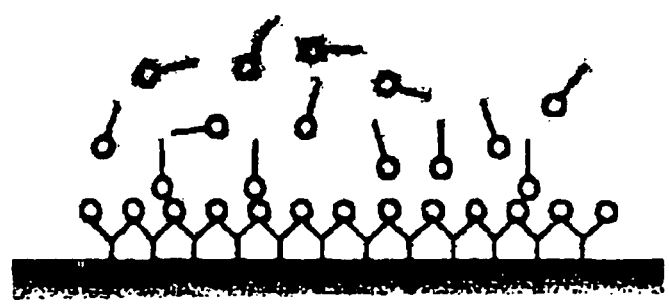
Figure 1:
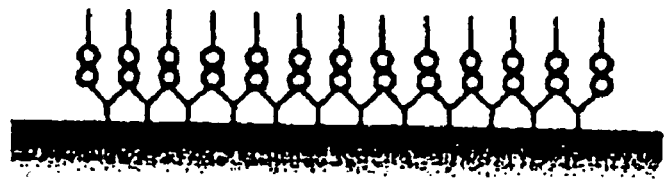

In the following, best modes are described by way of examples for practicing the present invention although the present invention is never limited by these examples.

Examples 1-24

A silicon wafer was coated with an antireflection filming agent (a product by Brewer Science, Inc., product name ARC29A) and subjected to a heating treatment at 215° C. for 60 seconds to form an antireflection film of 77 nm film thickness. On this antireflection film, a photoresist film of 460 nm film thickness was formed by coating with a positive-working resist (a product by Tokyo Ohka Kogyo Co., product name TARF-P6111).

The substrate on which this photoresist film was formed was subjected to a light-exposure treatment with an exposure light of 193 nm wavelength by using an ArF excimer stepper (a product by Nikon Corp., product name NSR-S302A) followed by a heating treatment at 130° C. for 90 seconds.

Nextly, a development treatment was conducted at 23° C. for 60 seconds by using a 2.38% aqueous solution of tetramethylammonium hydroxide followed by a rinse treatment.

The rinse treatment was conducted by dripping the first treatment solutions shown in the following Table 1 and Table 2 for 3 seconds at 500 rotations followed by rinse for 20 seconds with pure water. Thereafter, the second treatment solutions shown in Table 1 and Table 2 were dripped for 3 seconds at 500 rotations.

The contact angles of water on the resist pattern surface after each rinse treatment were determined by using a contact angle tester (a product by Kyowa Interface Science Co., product name CA-X150). The thus obtained results are shown in Table 1, Table 2 and Table 3.

In Table 1 and Table 2, meanwhile, "VP/VI" denotes a copolymer of vinyl pyrrolidone and vinyl imidazole [mass proportion is shown within ( )], "TMAH" denotes an aqueous solution of tetramethylammonium hydroxide, "ROB07802" denotes $CH_3N^+(C_2H_4OH)_3OH^-$ (a product by Nippon Nyukazai Co.), "ROB07803" denotes $(CH_3)_2N^+(C_2H_4OH)_2OH^-$ (a product by Nippon Nyukazai Co.), "EF-N331" denotes $(C_3F_7SO_2)_2NH$ (a product by Jemco Inc.), "PFMO3" denotes the compound expressed by the above-mentioned general formula (IX) (a product by Jemco Inc.) and "IPA" denotes isopropyl alcohol. The first rinse solutions in Examples 1-24 and the second rinse solutions in the Examples other than Examples 22-24 were each a 0.1% by mass aqueous solution and 0.005% by mass aqueous solution of the respective effective ingredients. The second treatment solutions in Examples 22-24 each contained 0.005% by mass of the effective ingredient in a mixed solvent. The mass proportion is shown within ( ).

TABLE 1

| | First rinse treatment | | | Second rinse treatment | |
|---|---|---|---|---|---|
| | Composition of treatment solution | | Contact angle | Composition of treatment solution | Contact angle |
| Example | Effective ingredient | Additive | after treatment | Effective ingredient | after treatment |
| 1 | VP/VI (50:50) | None | 25° | EF-N331 | 95° |
| 2 | VP/VI (50:50) | 0.05% aqueous TMAH solution | 24° | | 95° |
| 3 | VP/VI (50:50) | 0.01% aqueous choline solution | 25° | | 95° |
| 4 | VP/VI (50:50) | 0.05% aqueous choline solution | 26° | | 95° |
| 5 | VP/VI (50:50) | 0.10% aqueous choline solution | 26° | | 96° |
| 6 | VP/VI (50:50) | 0.20% aqueous choline solution | 27° | | 96° |
| 7 | VP/VI (50:50) | 0.01% aqueous ROB07802 solution | 27° | | 96° |
| 8 | VP/VI (50:50) | 0.01% aqueous ROB07803 solution | 27° | | 95° |
| 9 | Polyvinyl-imidazoline | None | 27° | | 100° |
| 10 | VP/VI (90:10) | None | 30° | | 84° |
| 11 | VP/VI (85:15) | None | 29° | | 87° |
| 12 | VP/VI (25:75) | None | 23° | | 100° |
| 13 | VP/VI (50:50) | None | 25° | PFMO3 | 103° |
| 14 | VP/VI (50:50) | 0.05% aqueous TMAH solution | 24° | | 102° |
| 15 | VP/VI (50:50) | 0.01% aqueous choline solution | 25° | | 102° |

TABLE 1-continued

| | First rinse treatment | | | Second rinse treatment | |
|---|---|---|---|---|---|
| | Composition of treatment solution | | Contact angle | Composition of treatment solution | Contact angle |
| Example | Effective ingredient | Additive | after treatment | Effective ingredient | after treatment |
| 16 | VP/VI (50:50) | 0.05% aqueous choline solution | 26° | | 101° |
| 17 | VP/VI (50:50) | 0.10% aqueous choline solution | 26° | | 101° |
| 18 | VP/VI (50:50) | 0.20% aqueous choline solution | 27° | | 100° |
| 19 | VP/VI (50:50) | 0.05% aqueous ROB07802 solution | 27° | | 102° |
| 20 | VP/VI (50:50) | 0.05% aqueous ROB07803 solution | 27° | | 103° |
| 21 | Polyvinyl-imidazoline | None | 37° | | 101° |

TABLE 2

| | First rinse treatment | | | Second rinse treatment | | |
|---|---|---|---|---|---|---|
| | Composition of treatment solution | | Contact angle | Composition of treatment solution | | Contact angle |
| Example | Effective ingredient | Additive | after treatment | Effective ingredient | Mixed solvent | after treatment |
| 22 | VP/VI (50:50) | None | 25° | Perfluoro-(undecanoic acid) | water/IPA (80:20) | 105° |
| 23 | | 0.02% aqueous TMAH solution | 24° | | water/trifluoro ethanol (95:5) | 108° |
| 24 | | 0.01% aqueous choline solution | 25° | | water/methanol (70:30) | 107° |

Comparative Examples 1 and 2

A resist pattern surface with a contact angle of 60 degrees obtained by the development treatment in the same manner as in Example 1 but without undertaking the first rinse treatment was subjected to the treatment with the second rinse solution EFN331 or PFMO3 to find that the contact angles were each 62 degrees showing almost no changes.

Examples 25-27

A silicon wafer was coated with an antireflection filming agent (a product by Brewer Science, Inc., product name ARC29A) and subjected to a heating treatment at 215° C. for 60 seconds to form an antireflection film of 77 nm film thickness.

On this antireflection film, a photoresist film of 460 nm film thickness was formed by coating with a positive-working resist (a product by Tokyo Ohka Kogyo Co., product name TARF-P6111).

The substrate on which this photoresist film was formed was subjected to a light-exposure treatment with an exposure light of 193 nm wavelength by using an ArF excimer stepper (a product by Nikon Corp., product name NSR-S302A) followed by a heating treatment at 130° C. for 90 seconds.

Nextly, a development treatment was conducted at 25° C. for 60 seconds by using a 2.38% aqueous solution of tetramethylammonium hydroxide followed by a rinse treatment.

The rinse treatment was conducted by dripping the first treatment solutions shown in Table 3 for 3 seconds at 500 rotations. And, a rinse treatment with pure water was conducted for 20 seconds followed by dripping the second treatment solutions shown in Table 3 for 3 seconds at 500 rotations.

The first rinse solutions in Examples 25-27 were each a 0.1% aqueous solution of VP/VI containing an additive. Further, the second treatment solutions each contained 0.005% by mass of the effective ingredient in the solvent. The mass proportion is shown within ( ).

By observing the line-and-space (110 nm/150 nm) pattern obtained by the above treatments with SEM, no pattern falling could be noted in this portion. Meanwhile, the aspect ratio of this pattern was about 4.18.

TABLE 3

| | First rinse treatment | | | Second rinse treatment | | |
|---|---|---|---|---|---|---|
| | Composition of treatment solution | | Contact angle | Composition of treatment solution | | Contact angle |
| Example | Effective ingredient | Additive | after treatment | Effective ingredient | Solvent | after treatment |
| 25 | VP/VI (50:50) | 0.02% aqueous choline solution | 25° | EF-N331 | water | 105° |
| 26 | | 0.05% aqueous choline solution | 24° | PFMO3 | water | 108° |
| 27 | | 0.02% aqueous choline solution | 25° | Perfluoro-(undecanoic acid) | water/trifluoro ethanol (99:1) | 107° |

Comparative Example 3

Pattern formation was conducted in just the same procedures as in the above-mentioned Examples 25 to 27 except that the rinse treatment with pure water alone was undertaken with omission of the inventive rinse treatments. The SEM observation of the thus obtained patterns indicated occurrence of pattern falling.

INDUSTRIAL UTILIZABILITY

According to the present invention, it is possible to form a pattern without a decrease in the characteristics of the resist pattern and pattern falling even in the development of the resist pattern highly liable to pattern falling as being a resist pattern of a line-and-space pattern which is so fine with 30 to 100 nm fineness and, in particular, with an aspect ratio so high as to be 3 or larger. Accordingly, the present invention is useful in the manufacture of various kinds of LSIs, ULSIs and the like.

The invention claimed is:

1. A method for the formation of a resist pattern by subjecting a photoresist layer provided on a substrate to an image-forming light-exposure followed by a development treatment, then conducting a treatment for adjusting the contact angle on the resist pattern surface against a contacting liquid to 40 degrees or smaller and then conducting a treatment for adjusting the contact angle to 70 degrees or larger followed by drying, wherein said treatment for adjusting the contact angle to 40 degrees or smaller comprises contacting the resist pattern surface still wet after the development treatment with a solution of a water-soluble resin having a nitrogen atom and wherein said treatment for adjusting the contact angle to 70 degrees or larger comprises contacting the resist pattern surface with a solution of a fluorine compound having solubility in water or solubility in an alcoholic solvent and having a functional group capable of forming a complex with the nitrogen atom of the water-soluble resin.

2. The method for the formation of a resist pattern described in claim 1 wherein the water-soluble resin having a nitrogen atom is a water-soluble resin having a nitrogen-containing heterocyclic group.

3. A combination of a first treatment solution and a second treatment solution for rinse of a resist pattern as developed in a series of: the first rinse step with the first treatment solution to follow a development treatment; and the second rinse step with the second treatment solution to follow the first step, wherein a treatment of the developed resist pattern with the first treatment solution is capable of adjusting the contact angle on the resist pattern surface against a contacting liquid to 40 degrees or smaller and a treatment with the second treatment solution is capable of adjusting the contact angle to 70 degrees or larger, wherein the first treatment solution is a solution of a water-soluble resin containing a monomeric unit having a nitrogen-containing heterocyclic group represented by the formula

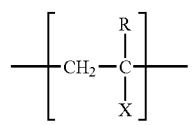

wherein R is a hydrogen atom or methyl group and X is a nitrogen-containing heterocyclic group; and wherein the second treatment solution is a solution containing a water-soluble or alcoholic solvent-soluble fluorine compound having a functional group capable of forming a complex with the nitrogen atom portion contained in the water-soluble resin.

4. The combination described in claim 3 wherein the monomeric unit having a nitrogen-containing heterocyclic group in the first treatment solution is at least one kind of monomeric unit selected from vinyl imidazole unit, vinyl imidazoline unit and vinyl pyrrolidone unit.

5. The combination described in claim 3 wherein the concentration of the water-soluble resin in the first treatment solution does not exceed 10% by mass.

6. The combination described in claim 3 wherein the water-soluble or alcoholic solvent-soluble fluorine compound in the second treatment solution is a fluorine compound represented by the formula

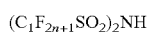

(n in the formula is an integer of 1 to 5),

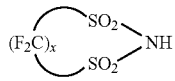

(x in the formula is an integer of 2 or 3)
or

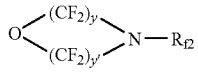

($R_{f2}$ in the formula is an alkyl group substituted by fluorine atoms for at least a part of the hydrogen atoms or an alkyl group having a hydroxyl group, alkoxy group, carboxyl group or amino group and y and y' are each an integer of 2 or 3).

7. The combination described in claim 3 wherein the concentration of the fluorine compound in the second treatment solution does not exceed 1% by mass.

8. The combination described in claim 3 wherein the water-soluble resin is a copolymer of at least two monomeric units selected from vinyl imidazole unit, vinyl imidazoline unit and vinyl pyrrolidone unit.

9. The combination described in claim 3 wherein the water-soluble or alcoholic solvent-soluble fluorine compound in the second treatment solution is a fluorine compound represented by the formula $R_{f1}$—Y ($R_{f1}$ in the formula is a group of a cyclic or linear chain hydrocarbon optionally containing an oxygen atom, a nitrogen atom or both and substituted by fluorine atoms for all or a part of the hydrogen atoms and Y is a residue of a carboxylic acid or sulfonic acid).

10. The combination described in claim 6 wherein the fluorine compound in the second treatment solution is expressed by

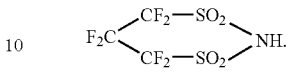

11. The combination described in claim 6 wherein the fluorine compound in the second treatment solution is expressed by

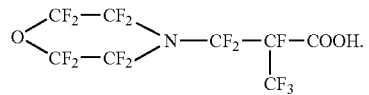

12. The combination described in claim 9 wherein the fluorine compound expressed by the formula, $R_{f1}$—Y, is a fluorine compound represented by the formula $C_mF_{2m+1}COOH$ or $C_mF_{2m+1}SO_3H$ (m in the formula is an integer of 10 to 15).

* * * * *